(12) United States Patent
Rana et al.

(10) Patent No.: US 9,325,323 B2
(45) Date of Patent: Apr. 26, 2016

(54) CMOS OSCILLATOR HAVING STABLE FREQUENCY WITH PROCESS, TEMPERATURE, AND VOLTAGE VARIATION

(71) Applicant: STMICROELECTRONICS INTERNATIONAL N.V., Amsterdam (NL)

(72) Inventors: Vikas Rana, Noida (IN); Ganesh Raj R, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/474,091

(22) Filed: Aug. 30, 2014

(65) Prior Publication Data

US 2016/0065220 A1    Mar. 3, 2016

(51) Int. Cl.
| | |
|---|---|
| *H03K 3/03* | (2006.01) |
| *H03L 1/00* | (2006.01) |
| *H03L 7/14* | (2006.01) |
| *H03L 7/18* | (2006.01) |
| *H03L 7/093* | (2006.01) |
| *H03L 7/089* | (2006.01) |
| *H03L 7/081* | (2006.01) |
| *H03L 7/099* | (2006.01) |

(52) U.S. Cl.
CPC ............... *H03L 1/00* (2013.01); *H03K 3/0315* (2013.01); *H03K 3/0322* (2013.01); *H03L 7/0812* (2013.01); *H03L 7/0891* (2013.01); *H03L 7/0895* (2013.01); *H03L 7/093* (2013.01); *H03L 7/0995* (2013.01); *H03L 7/0997* (2013.01); *H03L 7/148* (2013.01); *H03L 7/18* (2013.01)

(58) Field of Classification Search
CPC ......... H03L 7/0995; H03L 7/18; H03L 7/148; H03L 7/093; H03L 7/0812; H03L 7/087; H03L 7/0891; H03L 7/0896; H03L 7/0898; H03L 7/0997; H03L 7/107; H03L 1/00; H03L 7/0895; H03K 3/0315; H03K 3/0322; H03K 17/223; H03K 19/0963; H03K 19/215; H03K 2005/00071; H03K 23/005
USPC ............................. 331/57, 175, 183; 327/333
See application file for complete search history.

(56) References Cited

U.S. PATENT DOCUMENTS

| | | | |
|---|---|---|---|
| 3,995,232 A | 11/1976 | Laugesen | |
| 4,283,690 A | 8/1981 | Tarbouriech | |
| 4,910,471 A | 3/1990 | Brahmbhatt et al. | |
| 5,072,197 A | 12/1991 | Anderson | |
| 5,175,512 A * | 12/1992 | Self | H03K 3/011 326/81 |
| 5,180,995 A | 1/1993 | Hayashi et al. | |
| 5,250,914 A | 10/1993 | Kondo | |
| 5,905,412 A | 5/1999 | Rasmussen | |
| 6,127,898 A | 10/2000 | Naura | |

(Continued)

*Primary Examiner* — Arnold Kinkead
(74) *Attorney, Agent, or Firm* — Gardere Wynne Sewell LLP

(57) ABSTRACT

A clock signal generation circuit configured to generate the clock signal having a frequency that is maintained across variations in a number of operating conditions, such as changes in supply voltage, temperature and processing time. In an embodiment, the frequency spread of the generated clock signal of a PVT-compensated CMOS ring oscillator is configured to compensate for variations in the supply voltage, as well as for variations in process and temperature via a process and temperature compensation circuit. The PVT-compensated CMOS ring oscillator includes a regulated voltage supply circuit to generate a supply voltage that is resistant to variations due to changes in the overall supply voltage.

19 Claims, 6 Drawing Sheets

(56) References Cited

U.S. PATENT DOCUMENTS

| | | | |
|---|---|---|---|
| 6,628,558 B2 * | 9/2003 | Fiscus | G11C 5/147 327/512 |
| 7,321,270 B2 * | 1/2008 | Ouici | H03K 3/0315 331/175 |
| 2008/0061893 A1 | 3/2008 | Lakshmikumar et al. | |
| 2008/0290955 A1 | 11/2008 | Fort et al. | |

* cited by examiner

CMOS OSCILLATOR HAVING STABLE FREQUENCY WITH PROCESS, TEMPERATURE, AND VOLTAGE VARIATION

BACKGROUND

Clock generation is an important part of any electronic system. In integrated circuit devices, a crystal oscillator may provide excellent stability across a number of operating variables related to integrated circuit technology such as fabrication misalignment, voltage supply variations, and temperature variation (known as PVT variations in the industry). The most common material used for such a crystal oscillator is quartz. But, it is typically not possible to integrate a crystal oscillator onto an integrated circuit chip using a conventional CMOS process as such a step is not part of the IC processing, and therefore, must then be integrated into a related board. Further, requiring a customer to install a quartz crystal outside of the integrated circuit chip may increase the footprint that the chip package occupies, and, thus, may render the integrated circuit chip unsuitable for applications in which circuit-board area is at a premium.

To overcome the need for a quartz crystal in a crystal oscillator, a CMOS ring oscillator is a conventional solution that provides a ready-made solution to integrated circuit clocking. However, the output frequency of a CMOS ring oscillator does not remain constant over PVT variations. That is, PVT variations cause undesired frequency fluctuations in the clock signal generated and, therefore, are problematic for application requiring a more stable clock signal.

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be a clock signal generation circuit that is configured to generate the clock signal having a frequency that is maintained across variations in a number of operating conditions, such as changes in supply voltage, temperature and variations attributed to fabrication misalignments. In an embodiment, the frequency spread of the generated clock signal of a PVT-compensated CMOS ring oscillator is configured to compensate for variations in the supply voltage, as well as for variations in process and temperature via a process and temperature compensation circuit. The PVT-compensated CMOS ring oscillator includes a regulated voltage supply circuit to generate a supply voltage that is resistant to variations due to changes in the overall supply voltage.

In general, the PVT-compensated CMOS ring oscillator generates two identical currents used to ultimately generate a clock signal having a desired frequency. Together, these currents, as will be discussed below, are responsive to process and temperature variations in the PVT-compensated CMOS ring oscillator, and, therefore, compensates the output frequency of the oscillator clock CLK such that the output frequency is approximately constant over a range of voltage process and temperature variation. These and other aspects are discussed below with respect to FIGS. 1-9.

Figure 1:
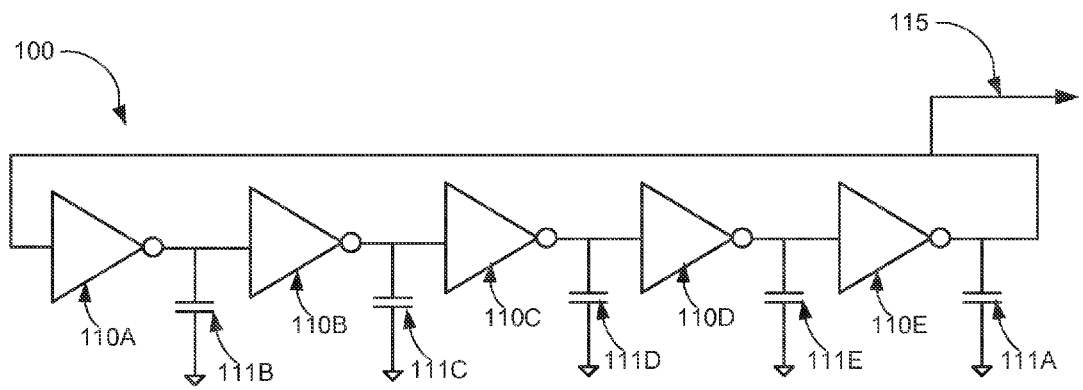
FIG. 1 is a circuit diagram of a conventional CMOS ring oscillator.

FIG. 1 is a circuit diagram of a conventional CMOS ring oscillator 100. As discussed in the background section, clock generation without using a quartz (or any vibration-based other) oscillator may be accomplished using a CMOS ring oscillator such as this one in FIG. 1. This ring oscillator 100 may be considered the most basic CMOS Ring Oscillator and includes of a series of an odd number of inverters 110A-110E. These inverters 110A-110E are feedback coupled such that each output of each inverter feeds to an input of another inverter. As shown, an output of inverter 110A is coupled to an input of inverter 110B and so on. At the last inverter 110E, its output is coupled back to the input of inverter 110A. Because of the odd number of inverters, there will always be an unstable state (i.e., a state where there is, effectively, positive feedback with a phase of at least 180° at a gain of at least 1) that leads to an oscillating signal generated at any given inverter 110A-110E output. To assist with stabilization, each inverter output is coupled to a respective timing capacitor 111A-111E to provide stabilization in order to keep the CMOS ring oscillator 100 from being out of control because the overall gain may be larger than unity.

Thus, a signal propagating around the CMOS oscillator ring 100 may pass through each inverter 110A-110E twice before the signal at a given measurement point (such as the output 115 of inverter 110E) returns to an initial state (i.e., oscillates back to a starting value). For example, if, at the input to the first inverter 110A, the signal has a state of logic 1 at a particular time, then the signal must propagate through all of the inverters 110A-110E once so that, at the input to the first inverter (which is the same node 115 as the output of inverter 110E), the signal as a state of logic 0, and then the signal passes through the inverters 110A-110E a second time so that, at the node 115, the signal has the starting state of logic 1 again. In this manner the frequency of oscillation is given as $F=\frac{1}{2}N\tau$ where N is number of stages in the CMOS ring oscillator 100, and τ is the delay associated with each one of the inverters 110A-110E (assuming that that the delays of all the inverters are the same).

In the CMOS ring oscillator 100 of FIG. 1, however, power consumption may be very high such that it is not practical for some applications where power is at a premium. Further, the oscillation frequency may vary abruptly and significantly as a supply voltage signal varies. This is because a change in supply voltage changes the "strength" at which each inverter 110A-110E can charge/discharge the timing capacitor 111A-111E of the next inverter, and also alters the voltage threshold at which an inverter charges the respective timing capacitor 111A-111E. In this CMOS ring oscillator 100, the trip point of each inverter 110A-110E (when the output of the inverter changes in response to a change in its respective input voltage) is a strong function of the power supply. Thus, the output frequency of the oscillator changes abruptly with supply voltage. Generally, the higher the supply voltage, the higher the oscillating frequency, and the lower the supply voltage, the lower the oscillating frequency. Furthermore, the frequency of the CMOS ring oscillator 100 of FIG. 1 also varies with temperature and process variations. These drawbacks of the simple CMOS ring oscillator 100 of FIG. 1 may be tempered by introducing additional delay between inverters 110A-110E in a so-called current starved ring oscillator as discussed next with respect to FIGS. 2 and 3A-3B.

Figure 2:
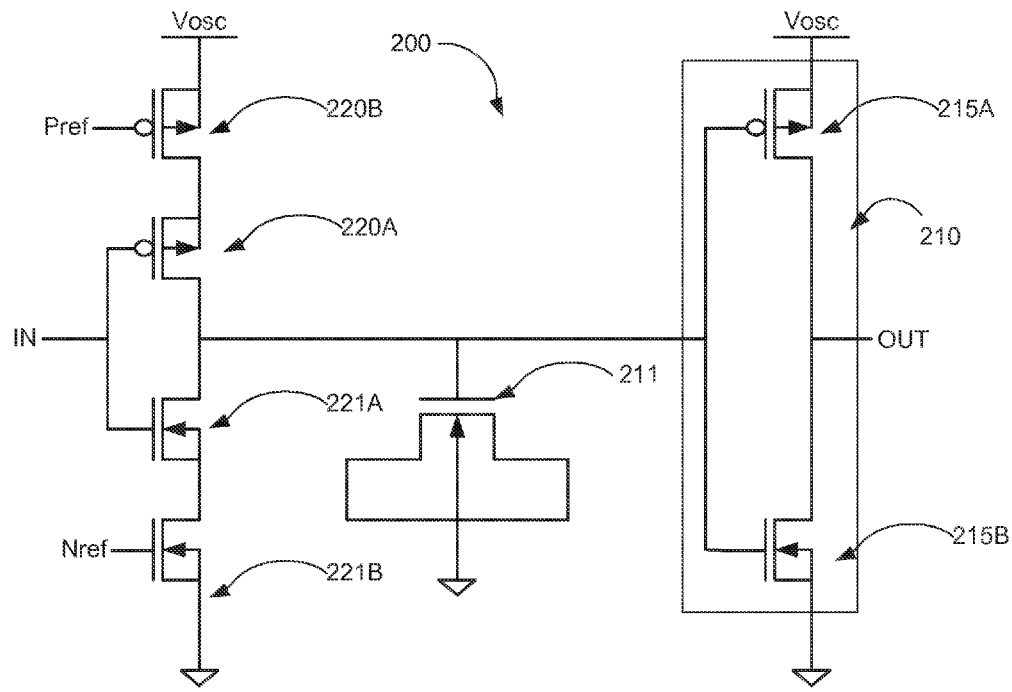
FIG. 2 is a circuit diagram of a conventional delay unit used in conjunction with a current-starved CMOS ring oscillator.
Figure 3A:
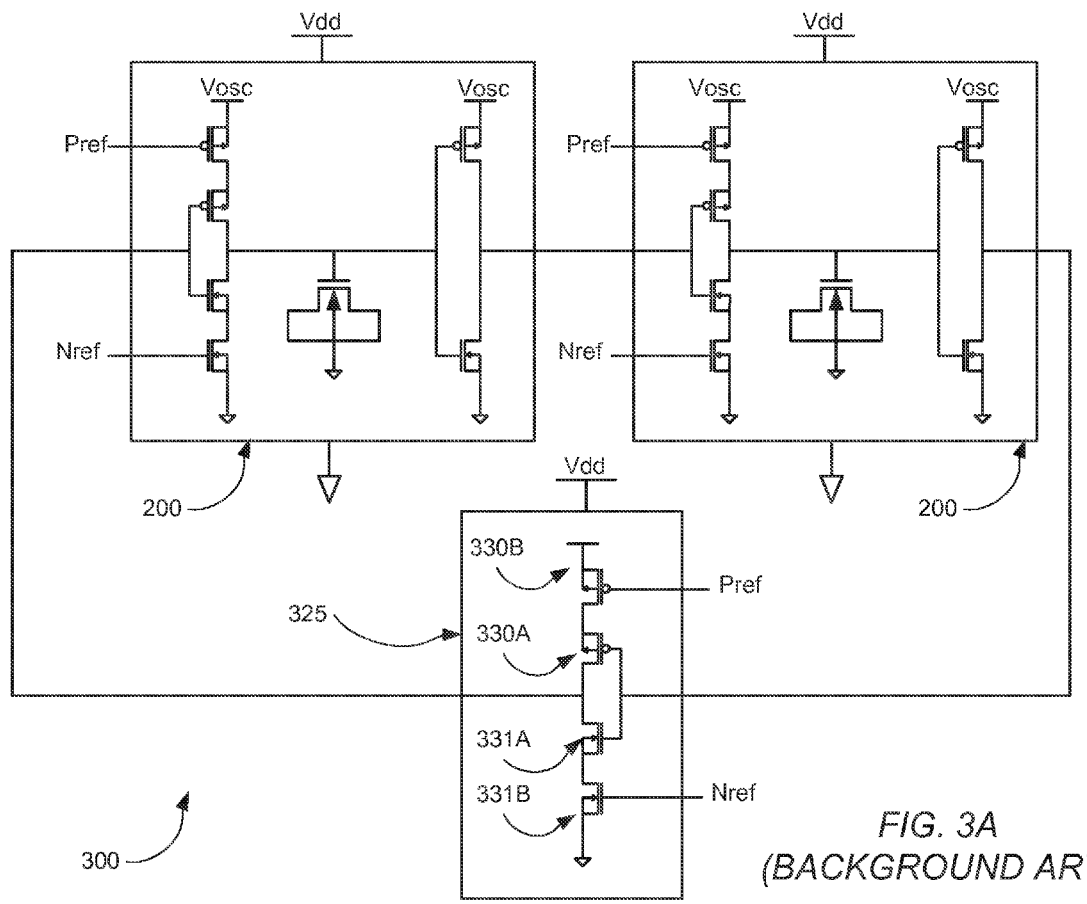
FIGS. 3A-3B are circuit diagrams of a conventional current-starved CMOS ring oscillator and reference signal generator utilizing the delay unit of FIG. 2.

FIG. 2 is a circuit diagram of a conventional delay unit 200 used in a current-starved CMOS ring oscillator 300 shown in FIG. 3A. In a current starved ring oscillator, a constant current from a current source may be used to charge and discharge the respective timing capacitor 211 of each delay unit 200. In this manner, the respective trip point of the inverter 210 of each delay unit 200 is further controlled. In FIG. 2, the inverter is shown with additional detail as having PMOS transistor 215A and NMOS transistor 215B having respective conductive nodes coupled to each other and to an output node. Further, the PMOS transistor 215A and NMOS transistor 215B have respective control nodes coupled to each other and coupled to the timing capacitor 211. Further yet, the PMOS transistor 215A has a second conductive node coupled to an oscillator supply voltage Vosc and the NMOS transistor 215B has a second conductive node coupled to ground.

In the delay unit 200, the left-hand side of the circuit comprises a tri-stated inverter such that current from an input PMOS transistor 220 is used to charge the timing capacitor 211, and current from an input NMOS transistor 221 is used to discharge the timing capacitor 211. Further, a reference PMOS transistor 220B is coupled to a bias voltage signal PREF that causes the current through the reference PMOS transistor 220B and input PMOS transistor 220A to stay at a predetermined constant value even if the overall supply voltage Vdd (shown in FIG. 3A) varies over a range. Likewise, a reference NMOS transistor 221B is coupled to a bias voltage signal NREF that causes the current through the reference NMOS transistor 221B and input NMOS transistor 221A to stay at a predetermined constant value even if GND varies (e.g., due to ground bounce) over a range. A circuit for generating voltage bias signals PREF and NREF is shown below with respect to FIG. 3B, however, the overall circuit of the current-starved CMOS ring oscillator is described next with respect to FIG. 3A FIG. 3A is a circuit diagrams of a conventional current-starved CMOS ring oscillator 300 utilizing the delay unit 200 of FIG. 2. In this circuit 300, two of the delay units 200 are coupled in a loop along with a feedback stage that 325 that may be similar to the delay units 200 does not include the timing capacitor 211 and inverter 210 of other delay units 200. The feedback stage 325 does not have a timing capacitor or inverter as this circuit is simply configured as a tri-stated inverter (e.g., only the left-had side of the delay unit 200 as described above with respect to FIG. 2). This is because for the current-starved CMOS ring oscillator 300 (as with any CMOS ring oscillator), an odd number of inverting stages is needed to provide oscillation. In this circuit 300 then, each of the delay units 200 with a timing capacitor 211 comprise an even number (2) of inverters 210, so for oscillation, there is an odd number (e.g., 1) of inverters in addition to the delay units 200 with the timing capacitors 211.

Figure 3B:
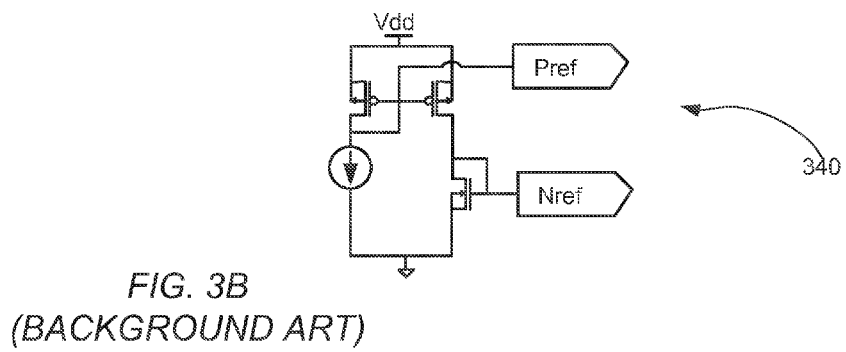

As briefly mentioned above, the voltage reference signals Pref and Nref are generated from the circuit 340 of FIG. 3B. In this circuit 340, the voltage reference signal Pref is set to a value designed to cause the current through the reference PMOS transistor 220B and input PMOS transistor 220A to stay at a predetermined constant value even if the supply voltage Vdd varies over a range. Similarly, the voltage reference signal Nref is set to a value designed to cause the current through the reference NMOS transistor 221B and input NMOS transistor 221A to stay at a predetermined constant value even if the GND varies over a range.

In the overall current-starved CMOS ring oscillator 300 as described above with respect to FIGS. 2 and 3A-3B, power consumption is decreased in when compared to the CMOS ring oscillator 100 of FIG. 1 because for a given transistor threshold drop Vt for the PMOS and NMOS transistors 215A and 215B of a respective inverter 210, there is less of a crowbar current in the inverter 210. However, the frequency of the oscillation will still vary with process, voltage, and temperature change. For example even though the current used to charge and discharge the timing capacitor 211 is constant with variations in supply voltage Vdd, the speed of the inverter 210 still changes with variations in supply voltage Vdd. Thus, in order to stabilize the oscillating frequency further over a range of variation in supply voltage Vdd, a regulated constant supply voltage circuit for supply voltage Vdd, may be used as described in the supply-compensated current-starved CMOS ring oscillator 400 of FIGS. 4A-4B described next.

Figure 4A:
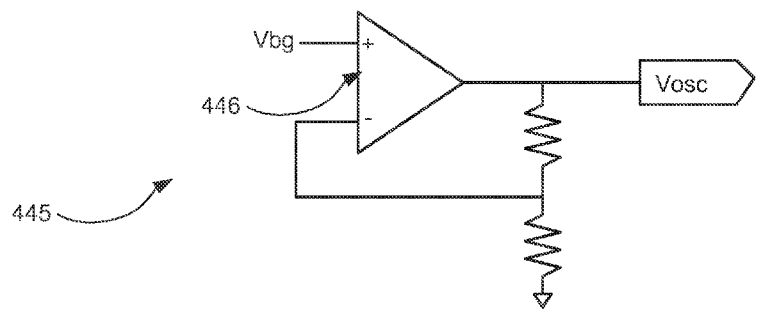
FIGS. 4A-4B are circuit diagrams of a supply-compensated current-starved CMOS ring oscillator.
Figure 4B:
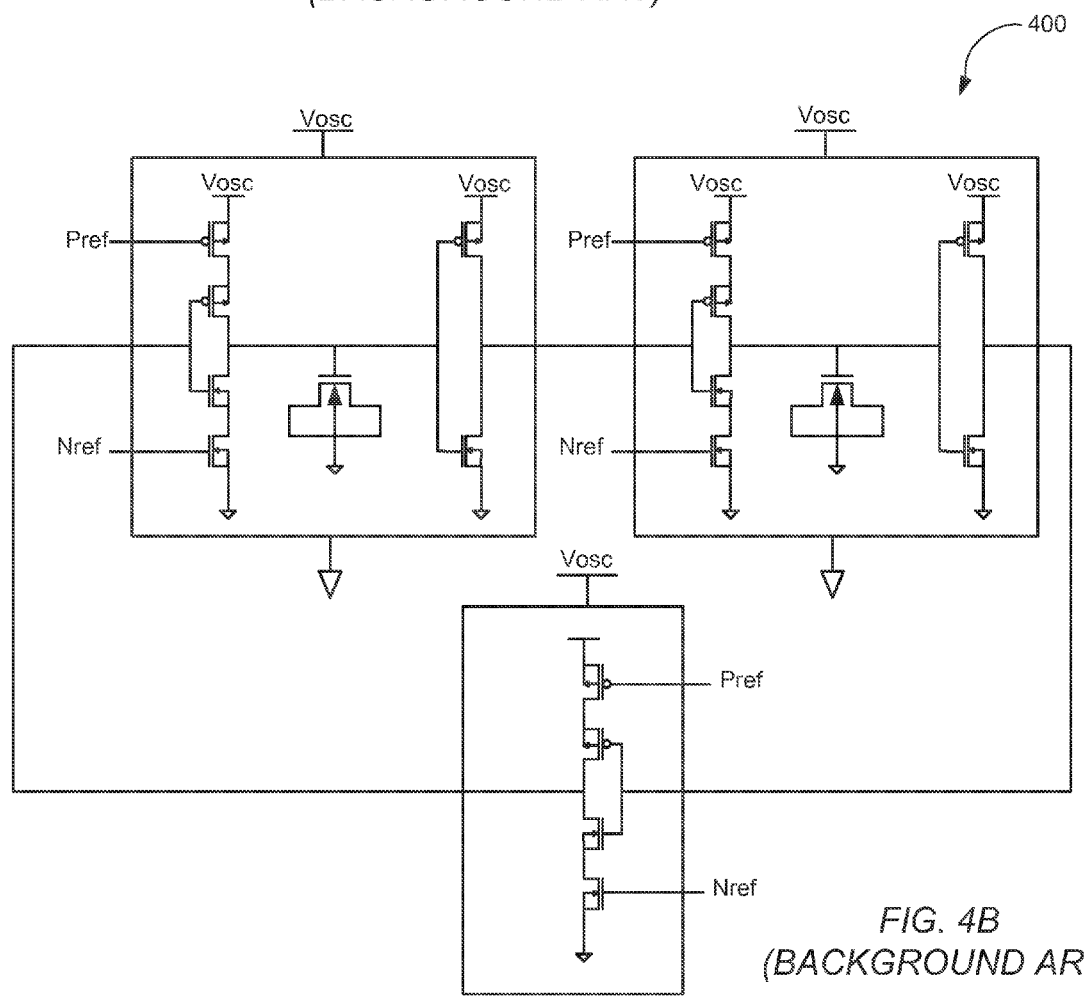

FIGS. 4A-4B are circuit diagrams of a supply-compensated current-starved CMOS ring oscillator 400. In this circuit, as detailed with respect to FIG. 4A, a voltage regulator 445 can be used to generate a regulated supply voltage Vosc for a current starved ring oscillator 400. To generate a regulated supply voltage Vosc, typically one reference voltage (a bandgap voltage reference Vbg) is utilized. An operational amplifier 446 in a closed loop configuration, (or a low-dropout (LDO) regulator (not shown)) may be is used to generate the regulated supply voltage Vosc. As can be seen, the bandgap voltage reference Vbg may be coupled to positive input of the operational amplifier 446 and the negative input may be coupled to the mid-node of a voltage divider at the output of the operational amplifier 446. In this manner, a regulated supply voltage Vosc is generated that in not subject to as much influence from variations in the overall supply voltage Vdd. Thus, as one can see in FIG. 4B, the regulated supply voltage Vosc is used in place of all previous supply voltage Vdd nodes when compared to the current-starved CMOS ring oscillator 300 of FIG. 3A.

Although the supply-compensated current-starved CMOS ring oscillator 400 of FIG. 4B is compensated for variations in the supply voltage Vosc, it is still not compensated for process and temperature variations.

Figure 5:
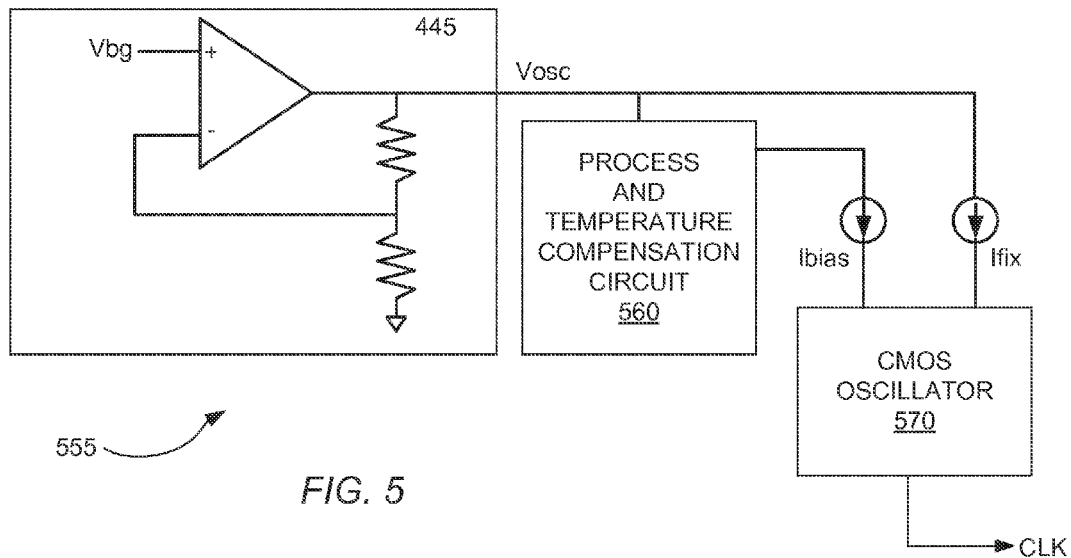
FIG. 5 is a circuit diagram of a PVT-compensated current-starved ring oscillator according to an embodiment of the subject disclosed herein.

FIG. 5 is a circuit diagram of a PVT-compensated current-starved ring oscillator 555 according to an embodiment of the subject disclosed herein. In this embodiment, the frequency spread of the generated clock output signal CLK of the oscillator 570 is not only compensated for variations in the supply voltage Vosc, but is also compensated for variations in process and temperature via the process and temperature compensation circuit 560. The PVT-compensated current-starved ring oscillator 555 also includes the previously described regulated voltage supply circuit 445 to generate a supply voltage Vosc that is resistant to variations due to changes in the overall supply voltage Vdd (not shown). In general, the circuit 555 generates two currents used in the oscillator 570, Icomp and Ifix. Together, these currents, as will be discussed below, are responsive to process and temperature variations in the circuit 555, and, therefore, compensates the output frequency of the clock output signal CLK such that the output frequency is approximately constant over a range of process and temperature variation.

Figure 6:
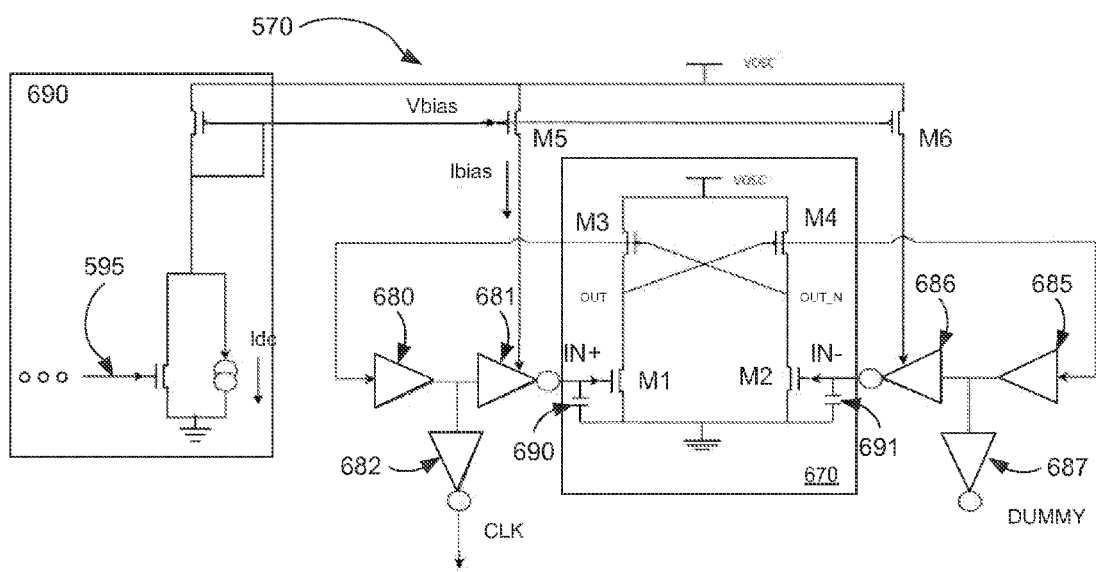
FIG. 6 is a circuit diagram of a current-starved level shifter-based ring oscillator according to an embodiment of the subject disclosed herein.

FIG. 6 is a circuit diagram of a current-starved level shifter-based ring oscillator 570 according to an embodiment of the subject disclosed herein. In this embodiment, several components are used that are somewhat similar to the odd-numbered inverters of conventional solutions (such as discussed in FIGS. 1-4), however, a different configuration of components leads to additional efficiencies and stability across PVT variations. Thus, in the embodiment of FIG. 6, the oscillator circuit 570 includes one level shifter 670, two current-starved inverters 681 and 686, two buffers 680 and 685, and two additional inverters 682 and 687. In the embodiment, the level shifter 670 acts like an inverter, thus, making the arrangement of the circuit 570 unstable, just as the odd number of stages in a conventional CMOS ring oscillator.

To this end, the capacitors 690 and 691 are sequentially charged by a constant current sourced by transistors M5 and M6 respectively, depending upon which pull-up path (either inverter 681 or inverter 686) is active. One of nodes IN+/IN− is static at ground while the other charges the respective timing capacitor 690 or 691 in ramp fashion until the switching threshold of the level shifter 670 is reached. At this point, the level shifter 670 quickly changes state and the pull-up of the complementary node switches on. The level shifter 670 is designed such that the NMOS transistors M1/M2 are stronger than the cross coupled PMOS transistors M3/M4. Therefore, the switching point of the level shifter 670 becomes a strong function of the threshold voltage of the NMOS transistors M1/M2. Further, the NMOS transistors M1 and M2 may typically each have the same threshold voltage. Thus the voltage ramp up depends on equation $$T_{ramp} = \frac{C_{1,2}(Vth - 0)}{I_{bias}} \quad (1)$$

As this phenomenon is periodic Tramp+Tdelay become the half period of the oscillation's time period, where Tdelay is the delay of the other elements in the signal chain (i.e., the respective buffers 680 and 685). Capacitors 690 and 691 are implemented using accumulation mode PMOS mode, such that the capacitance is fixed during the periodic activity on nodes IN+/IN−. The additional inverter 682 buffers the signal out of the circuit and other additional inverter 687 acts as a dummy to prevent loss of symmetry (i.e., the input capacitance of inverter 682 loads and effectively adds to the input capacitance of inverter 681 and inverter 687 is included to similarly add to the input capacitance of inverter 686 so that both sides of the oscillator have balanced/equal delays). Additionally, the buffers 680 and 685 are included to speed up the rise and fall times of the signals input to the current-starved inverters 681 and 686, respectively, to prevent drawing large crowbar currents.

In an example of operation, consider an embodiment where the voltage at node IN− across the capacitor 691 is 0V, and the voltage at node IN+ across the capacitor 690 is ramping up from 0V toward the threshold voltage (Vth) of the NMOS transistor M1. This means that the output of the current-starved inverter 681 is ramping from logic 0 to logic 1, and, therefore, that the input of the current-starved inverter 681 (the output of buffer 680) is logic 0. Therefore, the overall clock output signal CLK is at logic 1 through the additional inverter 682.

In response to the voltage at node IN+ equaling or exceeding the threshold voltage Vth of the NMOS transistor M1, then NMOS transistor M1 turns on. Because NMOS transistor M1 is stronger than PMOS transistor M3, the NMOS transistor M1 quickly pulls the node OUT down to the threshold voltage Vth of the PMOS transistor M4, thus turning on PMOS transistor M4. The PMOS transistor M4, now being on, quickly pulls up the node OUT_N to logic 1 (the node IN− is 0 per initial conditions outlined above, so NMOS transistor M2 is off). When the node OUT_N is at logic 1, PMOS transistor M3 turns off. Therefore, NMOS transistor M1 quickly pulls the node OUT down to logic 0 so that little or no crowbar current flows through PMOS transistor M3 and NMOS transistor M1. Having little crowbar current in the level shifter leads to efficiencies of power consumption.

Furthermore, the logic 1 at node OUT_N propagates through the left-side buffer 680 to the input of current starved inverter 681 and the additional inverter 682. Therefore, the additional inverter 682 transitions the clock output signal CLK to a logic 0, and the current-starved inverter 681 begins to discharge the capacitor 690. As is described further below, the discharge current is not limited as it is in the circuit of FIGS. 3-4, the current-starved inverter 681 discharges the capacitor 690 relatively quickly; more quickly than the current-starved inverter 686 can charge the capacitor 691.

Turning attention the right-had side of the oscillator circuit 570, the logic 0 at node OUT propagates through the right-side buffer 685 to the input of the current-starved inverter 686, which begins to charge the capacitor 691 from 0 volts to the threshold voltage Vth of NMOS transistor M2. In response to the voltage at node IN− equaling or exceeding the threshold voltage Vth of NMOS transistor M2, the NMOS transistor M2 turns on. Because NMOS transistor M2 is stronger than PMOS transistor M4, NMOS transistor M2 quickly pulls the node OUT_N down to the threshold voltage Vth of the PMOS transistor M3, thus turning the PMOS transistor M3 on. Then, PMOS transistor M3 quickly pulls up the node OUT to logic 1 (node IN+ is 0 per above, so NMOS transistor M1 is off), which turns off PMOS transistor M4. Therefore, NMOS transistor M2 quickly pulls node OUT_N down to logic 0 so that little or no crowbar current flows through PMOS transistor M4 and NMOS transistor M2.

Moreover, the logic 0 at node OUT_N propagates through the left-side buffer 680 to the input of the current-starved inverter 681 and the additional inverter 682. Therefore, the additional inverter 682 transitions the output CLK to a logic 1, and the current-starved inverter 681 begins to charge the capacitor 690 to begin the above-described cycle again.

Per equation (1) as described above, the time period of the oscillation is proportional to the ratio of Ibias and the threshold voltage Vth of the NMOS transistors M1/M2, therefore one may control the frequency to be relatively constant if Ibias were generated with a strong correlation to the threshold voltage Vth, which varies with process and temperature. Such control may be implemented through process and temperature circuit 560 and the current mirror of PMOS transistors M5/M6 as described in more detail below with respect to FIG. 7.

Figure 7:
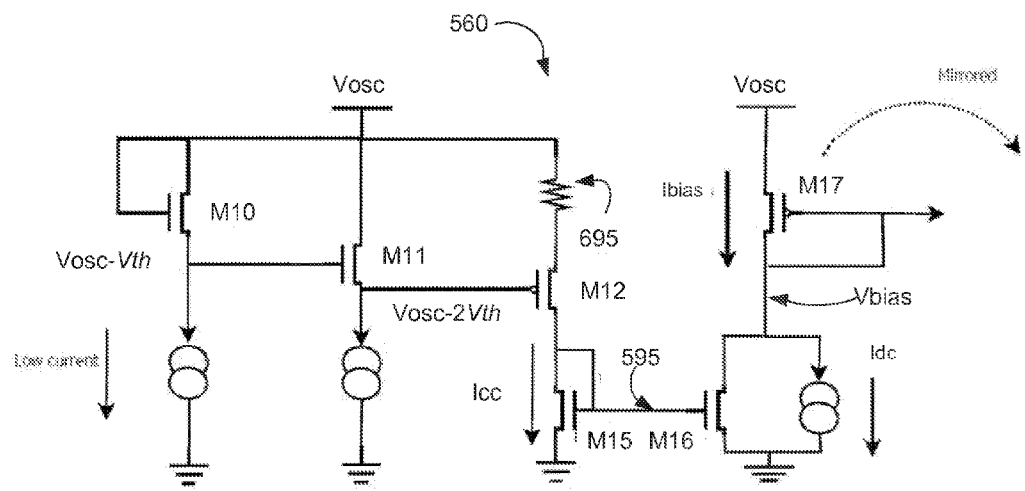
FIG. 7 is a circuit diagram of a process and temperature variation generator used in conjunction with the ring oscillator of FIG. 5 according to an embodiment of the subject disclosed herein.

FIG. 7 is a circuit diagram of a process and temperature variation generator 560 used in conjunction with the oscillator circuit 570 of FIG. 6 according to an embodiment of the subject disclosed herein. In this embodiment, process and temperature variation generator 560 is used to generate the current Ibias as described above with respect to FIG. 6. A skilled artisan understands that the circuit 560 of FIG. 7 is but one way to implement the generator circuit 560 as other embodiments for generating the current Ibias may also be realized. In this embodiment a pair of cascaded NMOS transistors M10 and M11 are used to generate a voltage that is the supply voltage Vosc less two threshold voltage drops. Thus, in the circuit 560 of FIG. 7, low current may be drawn through NMOS transistors M10 and M11, from respective drain nodes coupled to a supply voltage Vosc. The control node of the NMOS transistor M10 is also coupled to the supply voltage Vosc. The source node of the NMOS transistor M10 is at Vosc−Vth, and the source node of the NMOS transistor M11 is at Vosc−2Vth, where it is assumed that the threshold voltage Vth is the same for both NMOS transistors M10 and M11. The voltage at the source node of the NMOS transistor M11 (Vosc−2Vth) is then converted to a correction current Icc using a conventional common source PMOS transistor M12 with source degeneration stage, such that the trans-conductance is linear over the voltage range, hence making the correction current Icc proportional to Vth.

This correction current Icc is added to a fixed current Idc and mirrored (via current mirror M15/M16) appropriately to generate Pbias (see FIG. 6), such that Ibias (FIG. 6) equals correction current Icc+Idc, and tracks the variation in the threshold voltages Vth of the transistors in the circuit 560. The current Ibias is then mirrored via PMOS transistor M17 to the PMOS transistors M5 and M6 of FIG. 6 to deliver the current Ibias to the respective current-starved inverters 681 and 686. This correction current Icc cancels the variation in threshold voltage Vth of the NMOS transistors M1 and M2 caused by process and temperature at least to a 1st order (one is more concerned with variation in Vth of the NMOS transistors M1 and M2 than in variation in any PMOS transistor because as discussed above, the frequency of oscillation of the circuit of FIG. 6 depends more heavily on threshold voltage of the NMOS transistors M1 and M2 than any PMOS transistor). For example, if the threshold voltage Vth of the NMOS transistors M1 and M2 increases, then the correction current Icc increases, Ibias increases, and, therefore, the NMOS transistors M1 and M2 (FIG. 6) can charge the capacitors 690 and 691 more quickly to compensate for the increase in the NMOS threshold voltage Vth. Conversely, if the threshold voltage Vth of the NMOS transistors M1 and M2 decreases, then the correction current Icc decreases, Ibias decreases, and, therefore, NMOS transistors M1 and M2 (FIG. 6) can charge the capacitors 690 and 691 more slowly to compensate for the decrease in the NMOS threshold voltage Vth.

Even though the circuit 560 of FIG. 7 effectively acts to reduce the correction current Icc, and thus Ibias, for increases in the NMOS threshold voltage, the circuit 560 still increases the correction current Icc and Ibias, overall for increases in both the NMOS and PMOS threshold voltages Vth because the correction current Icc depends more on the NMOS threshold voltage than it does on PMOS threshold voltage. One can substantially eliminate dependence of the correction current Icc on the PMOS threshold voltage by setting $g_m R_s \gg 1$, where $g_m$ is the transconductance of the PMOS transistor M12 of the circuit 560 of FIG. 7, and $R_s$ is the resistance of the resistor 695.

Moreover, still referring to FIG. 7, although the resistance of the resistor 695 varies with process and temperature in a way that does not assist the temperature/process compensation of the circuit 560, the value of resistor 695 can be trimmed during manufacture to be a predetermined value at a predetermined temperature so that the trimming can at least compensate for changes in the resistance of resistor 695 due to process from chip to chip.

The conventional CMOS oscillator as discussed above with respect to FIGS. 1-4 may typically have a variation in frequency +/−25%. By compensating for the PVT variations in the embodiments described with respect to FIGS. 5-7, the variation in frequency decreases to +/−4.2% in all PVT conditions. Further, because of current starved architecture of the embodiments in FIGS. 5-7, power consumption is low. Further yet, duty-cycle variation in the clock output signal CLK is much less because of the symmetric nature of the oscillator circuit 570 design. The design is also more immune to random component variation, as the components on each "side" of the oscillator circuit 570 can be easily matched with its corresponding component on the "other side"; for example, referring to FIG. 6, NMOS transistor M1 can be matched to NMOS transistor M2, PMOS transistor M3 can be matched to PMOS transistor M4, current-starved inverter 681 can be matched to current-starved inverter 686, and so on.

In alternate embodiments, the circuits of FIG. 6 can be designed so that the clock frequency depends more on the PMOS threshold voltages than on the NMOS threshold voltages, and the circuit of FIG. 7 can be designed so that the correction current Icc depends more on the PMOS threshold voltages than on the NMOS threshold voltages. Further, a skilled artisan understands that the above-described embodiments may be implemented in 110 nm (BCD9S) technology for ~21 MHz target frequency for temperature variations of −40 to 160 degrees Fahrenheit with supply voltages that range from 3.0 V to 5.5 V. In other embodiments, digital control may be implemented as discussed next with respect to FIG. 8.

Figure 8:
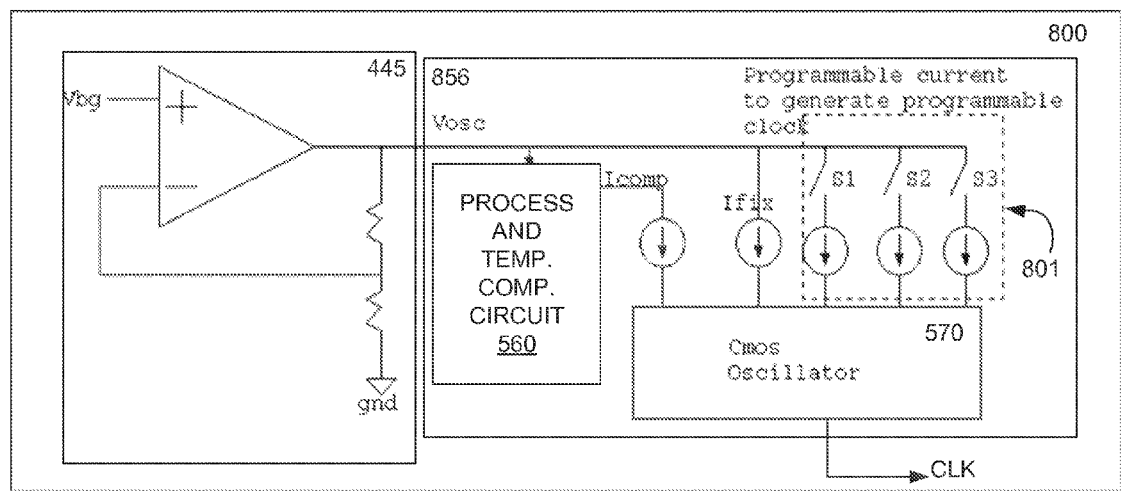
FIG. 8 is a circuit diagram of a PVT-compensated current-starved ring oscillator having a digital-to-analog control circuit according to an embodiment of the subject disclosed herein.

FIG. 8 is a circuit diagram of a PVT-compensated current-starved ring oscillator 800 having a digital-to-analog compensation network 801 according to an embodiment of the subject disclosed herein. In this embodiment, several switches (S1, S2 and S3 are shown here) may be programmed to generate a specific frequency of the output clock signal CLK of the CMOS oscillator 570. By engaging additional paths for the current Ifix, the magnitude of the current Ifix that is used at the CMOS oscillator 570 to drive the clock output signal CLK may be mathematically reduced to achieve a desired frequency.

The mean output frequency of clock output signal CLK is programmable by trimming the aspect ratio (equivalent dimension) of the capacitors 690 and 691, the aspect ratios of the PMOS transistors M5 and M6, or by trimming the value of Idc using the existing compensation network 801. With the compensation network, multiple frequencies can be generated by changing the value of Idc used in the circuit 560 of FIG. 7; or, a programmable current Ifix can be added to Ibias in FIG. 6 to adjust the frequency of the output clock signal CLK.

Figure 9:
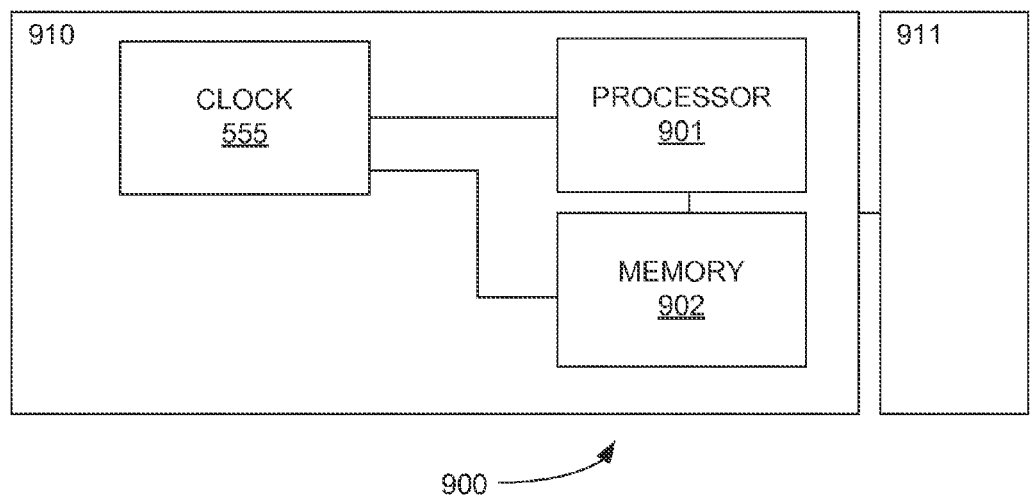
FIG. 9 is a block diagram of a system having the PVT-compensated current-starved ring oscillator according to an embodiment of the subject disclosed herein

FIG. 9 is a block diagram of a system 900 having the PVT-compensated current-starved ring oscillator 555 according to an embodiment of the subject disclosed herein. In the system, the oscillator 555 may be itself be a single integrated circuit chip or be disposed on an integrated circuit chip 910 along with a processor 901 and a memory 902. In other embodiments, the processor 901 and memory may be individual integrated circuit chips disposed on a printed circuit board 910 along with the oscillator 555. Further yet, the board/chip 910 may be coupled to yet another board/chip 911.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A device, comprising:
   a node configured to receive a voltage signal;
   a first circuit coupled to the node and configured to generate a clock signal in response to the voltage signal; and
   a second circuit coupled to the first circuit and configured to alter the generated clock signal in response to an operating condition;
   wherein the first circuit comprises a CMOS oscillator comprising:
      a level shifter;
      a first current-starved inverter coupled to the level shifter;
      a first buffer coupled to the first current-starved inverter;
      a first capacitor coupled to the first current-starved inverter and coupled to the level shifter;
      a second current-starved inverter coupled to the level shifter;
      a second buffer coupled to the second current-starved inverter; and
      a second capacitor coupled to the second current-starved inverter and coupled to the level shifter.

2. The device of claim 1, wherein the operating condition comprises an operating temperature.

3. The device of claim 1, wherein the altering of the generated clock signal corresponds to a compensation due to a fabrication misalignment.

4. The device of claim 1, wherein the operating condition comprises a voltage level of a supply voltage.

5. The device of claim 1, wherein the CMOS oscillator further comprises:
   a third inverter coupled to the first current-starved inverter and coupled to the first buffer; and
   a fourth inverter coupled to the second current-starved inverter and coupled to the second buffer.

6. The device of claim 1, wherein the second circuit comprises:
   a transistor circuit configured to generate a voltage at a node that is responsive to changes in process and temperature variables in the device;
   a current generator coupled to the transistor circuit and configured to generate a correction current corresponding to the voltage at the node; and
   a translation circuit coupled to the current generator and configured to translate the correction current into a bias current corresponding to the changes in process and temperature variables.

7. The device of claim 1, wherein the second circuit comprises a voltage regulator configured to generate a regulated supply voltage that is responsive to variations in a voltage level of a supply voltage.

8. An oscillator, comprising:
   a voltage supply node;
   a reference node;
   a first transistor having a first conduction node, a second conduction node coupled to the reference node, and a control node;
   a second transistor having a first conduction node, a second conduction node coupled to the reference node, and a control node;
   a third transistor having a first conduction node coupled to the voltage supply node, a second conduction node coupled to the first conduction node of the first transistor, and a control node coupled to the first conduction node of the second transistor;
   a fourth transistor having a first conduction node coupled to the voltage supply node, a second conduction node coupled to the first conduction node of the second transistor, and a control node coupled to the first conduction node of the first transistor;
   a first current-starved inverter having an input node coupled to the control node of the third transistor and an output node coupled to the first conduction node of the first transistor;
   a second current-starved inverter having an input node coupled to the control node of the fourth transistor and an output node coupled to the first conduction node of the second transistor;
   a first capacitor having a first node coupled to the first node of the first transistor and a second node coupled to the reference node; and
   a second capacitor having a first node coupled to the first node of the second transistor and a second node coupled to the reference node.

9. The oscillator of claim 8, further comprising:
   a first current injection node configured to receive a first current responsive to a change in an operating condition, the first current injection node coupled to the first current-starved inverter; and
   a second current injection node configured to receive a second current responsive to the change in an operating condition, the second current injection node coupled to the second current-starved inverter.

10. The oscillator of claim 9, further comprising a bias current generator configured to generate the first and second currents, the bias current generator having:
    a transistor circuit configured to generate a voltage at a node that is responsive to changes in process and temperature variables;
    a current generator coupled to the transistor circuit and configured to generate a correction current corresponding to the voltage at the node; and
    a translation circuit coupled to the current generator and configured to translate the correction current into the first and second currents corresponding to the changes in process and temperature variables.

11. The oscillator of claim 8, further comprising:
    a first buffer coupled between the input node of the first current-starved inverter and the control node of the third transistor;
    a second buffer coupled between the input node of the second current-starved inverter and the control node of the fourth transistor.

12. The oscillator of claim 8, further comprising:
    a third inverter having an input node coupled to the input node of the first current-starved inverter; and
    a fourth inverter having an input node coupled to the input node of the second current-starved inverter.

13. A circuit, comprising:
    a level shifter having a first input, second input, first output and second output;

a first inverter coupled to drive the first input;
a first capacitor coupled between the first input and a reference supply node;
a second inverter coupled to drive the second input;
a second capacitor coupled between the second input and the reference supply node;
wherein the first and second inverters are biased by a bias current;
wherein the second output is coupled to an input of the first inverter;
wherein the first output is coupled to an input of the second inverter; and
a bias generator circuit configured to generate the bias current; said bias generator circuit generating said bias current proportional to MOS transistor threshold voltage.

14. The circuit of claim 13, wherein the bias generator circuit comprises:
a first MOS transistor of a first conductivity type;
a second MOS transistor of the first conductivity type coupled in cascade to the first MOS transistor;
a third MOS transistor of a second conductivity type coupled in cascade to the second MOS transistor, said third MOS transistor generating a correction current proportional to threshold voltage of the first and second MOS transistors; and
a current mirroring circuit configured to generate said bias current from said correction current.

15. The circuit of claim 14, wherein the bias generator circuit further comprises: a summation circuit configured to add a fixed current to the correction current to generate said bias current.

16. The circuit of claim 13, further comprising:
a first buffer circuit coupled between the second output and the input of the first inverter; and
a second buffer circuit coupled between the first output and the input of the second inverter.

17. The circuit of claim 13, wherein said MOS transistor threshold voltage is a threshold voltage of an nMOS transistor.

18. The circuit of claim 17, wherein the nMOS transistor is a pull-down transistor in said level shifter, said nMOS transistor controlled by the first input and coupled between the first output and the reference supply node.

19. The circuit of claim 13, wherein the bias generator circuit comprises:
a transistor circuit configured to generate a voltage at a node that is responsive to changes in process and temperature;
a current generator coupled to the transistor circuit and configured to generate a correction current corresponding to the voltage at the node; and
a translation circuit coupled to the current generator and configured to translate the correction current into the bias current.

* * * * *